(12) United States Patent
Fukudome et al.

(10) Patent No.: US 7,939,744 B2
(45) Date of Patent: May 10, 2011

(54) THERMOELECTRIC ELEMENT

(75) Inventors: Masato Fukudome, Kokubu (JP); Kazuhiro Nishizono, Kokubu (JP); Koichi Tanaka, Kokubu (JP); Kenichi Tajima, Kokubu (JP)

(73) Assignee: Kyocera Corporation, Kyoto (JP)

( * ) Notice: Subject to any disclaimer, the term of this patent is extended or adjusted under 35 U.S.C. 154(b) by 352 days.

(21) Appl. No.: 10/226,087

(22) Filed: Aug. 21, 2002

(65) Prior Publication Data

US 2003/0089391 A1    May 15, 2003

(30) Foreign Application Priority Data

Aug. 21, 2001 (JP) ................. 2001-250298
Dec. 26, 2001 (JP) ................. 2001-393084

(51) Int. Cl.
| | |
|---|---|
| H01L 35/30 | (2006.01) |
| H01L 35/28 | (2006.01) |
| H01L 35/16 | (2006.01) |
| H01L 35/20 | (2006.01) |
| C01B 9/00 | (2006.01) |
| C01B 25/14 | (2006.01) |
| C01B 19/04 | (2006.01) |
| C04B 35/00 | (2006.01) |

(52) U.S. Cl. .............. 136/236.1; 136/205; 136/211; 136/212; 136/238; 136/239; 136/240; 423/463; 423/508; 423/509; 252/62.3 T

(58) Field of Classification Search .............. 136/238, 136/240, 211, 212, 205, 236.1, 239; 423/463, 423/508, 509; 252/62.3 T
See application file for complete search history.

(56) References Cited

U.S. PATENT DOCUMENTS

| | | | | |
|---|---|---|---|---|
| 3,517,435 | A * | 6/1970 | Winkler et. al. | 264/112 |
| 4,588,520 | A * | 5/1986 | Jayadev et al. | 252/512 |
| 4,687,879 | A * | 8/1987 | Hendricks | 136/212 |
| 5,981,863 | A * | 11/1999 | Yamashita et al. | 136/201 |
| 6,043,424 | A * | 3/2000 | Horio et al. | 136/236.1 |
| 6,410,840 | B1 * | 6/2002 | Sudo et al. | 136/201 |
| 6,596,226 | B1 * | 7/2003 | Simard et al. | 419/32 |
| 6,747,572 | B2 * | 6/2004 | Bocko et al. | 340/870.16 |
| 2004/0042181 | A1 * | 3/2004 | Nagasaki | 361/725 |

FOREIGN PATENT DOCUMENTS

| | | | |
|---|---|---|---|
| JP | 2002-223013 A | * | 8/2002 |
| JP | 2002-232024 A | * | 8/2002 |
| JP | 2002-232025 A | * | 8/2002 |

OTHER PUBLICATIONS

Augustine et al, "Growth, morphology, and microindentation analysis of Bi2Se3, Bi1.8In0.2Se3, and Bi2Se2.8Te0.2 single crystals," Materials Research Bulletin, vol. 36, issues 13-14, Nov. 1, 2001, pp. 2251-2261.*
Dubrovina et al., "Electrical Properties and Structure of Extruded Bi2Te2.88Se0.12", Moscow Inst. of Steel and Alloys, Translated from Poroshkovaya Metallurgiya, No. 2 (218), pp. 59-63 [pp. 125-129], Feb. 1981.*
Bublik et al., "Influence of Growth Conditions on Structure, Composition Homogeneity and Mechanical Properties of Thermoelectric Crystals for Coolers", 16th International Conference on Thermoelectrics (no month, 1997), pp. 118-121.*
Fleurial et al., "Miniaturized Thermoelectric Power Sources", 34th Intersociety Energy Conversion Eng. Conf. Proc., Vancouver, BC, Canada, 992569 (no month, 1999), pp. 1-5.*
Wada et al., "The Anisotropic Powder Metallurgy of n-Type Bi2Te2. 85Se0.15 Thermoelectric Material", J. Mater. Res., vol. 5, No. 5, May 1990, pp. 1052-1057.*
Dubrovina et al., "Electrical Properties and Structure of Extruded Bi2Te2.88Se0.12", Moscow Inst. of Steel and Alloys, Translated from Poroshkovaya Metallurgiya, No. 2 (218), pp. 59-63, Feb. 1981.*
Seo et al., Thermoelectric Properties of Hot-Pressed n-Type Bi2Te2. 85Se0.15 Compounds Doped with SbI3, Mat. Sci. and Eng., B49, (no month) 1997, pp. 247-250.*
Noda et al., "Preparation and Characterization of Segmented-Type Thermoelectric Branches of Bi2Te3/PbTe", 16th International Conference on Thermoelectrics (no month, 1997), pp. 371-374.*
Yoneda et al., "Thermoelectric Energy Conversion Materials. Grain Size Effect on Thermoelectric Properties of PbTe by Spark Plasma Sintering", Journal of the Japan Institute of Metals (no month, 1999), vol. 63, No. 11, pp. 1461-1467.*

* cited by examiner

*Primary Examiner* — Edna Wong
(74) *Attorney, Agent, or Firm* — DLA Piper LLP (US)

(57) ABSTRACT

A thermoelectric element formed of a sintered body of a semiconductor comprising at least two kinds of elements selected from the group consisting of Bi, Te, Se and Sb, and having a micro-Vickers' hardness of not smaller than 0.5 GPa. The thermoelectric element has a hardness of not smaller than 0.5 GPa, and exhibits a large resistance against deformation, and is not easily broken by deformation. As a result, breakage due to deformation is prevented and a highly reliable thermoelectric element is realized even when a shape factor which is a ratio of the sectional area of the thermoelectric element to the height thereof, is increased and even when the element density is increased.

5 Claims, 1 Drawing Sheet

THERMOELECTRIC ELEMENT

BACKGROUND OF THE INVENTION

1. Field of the Invention

The present invention relates to a thermoelectric element having excellent thermoelectric characteristics, which is favorably used for cooling the heat-generating members such as semiconductors.

2. Description of the Related Art

A thermoelectric element utilizing the Peltier effect is simple in construction, easy to handle, stably maintains its characteristics and is, hence, drawing attention concerning a use over a wide range of applications. In particular, owing it its locally cooling performance and precise temperature control near room temperature, the thermoelectric element has been utilized as a thermoelectric module being electrically connected and arranged on a support substrate in a device (semiconductor laser, optical integrated circuit, etc.) which must be precisely controlled to remain at a constant temperature and in small refrigerators.

If the thermoelectric element utilizing the Peltier effect is placed under the poorly heat-radiating conditions, the temperature of the whole element is raised due to the Joule heat generated in the element, and it becomes no longer possible to maintain the temperature of the element constant. To avoid such an inconvenience, it has been attempted to set the shape of the thermoelectric element used for the thermoelectric module to lie within a predetermined range. This is to control the amount of heat radiation needed by the element during the operation at a maximum efficiency to effect efficient cooling by defining optimum dimensional values of the thermoelectric element. For example, Japanese Unexamined Patent Publication (Kokai) No. 125963/1998 (prior art A) teaches realizing a stable and high energy conversion efficiency by setting a shape factor (L/S) expressed by a ratio of the element thickness L to the element sectional area S to lie within a range of from 300/m to 1200/m.

In each thermoelectric module, there are usually arranged several tens of thermoelectric elements (p-type thermoelectric element) comprising the p-type semiconductors and several tens of thermoelectric element (n-type thermoelectric element) comprising the n-type semiconductors. Japanese Unexamined Patent Publication (Kokai) No. 97472/1996 (prior art B) teaches increasing the number of the thermoelectric elements is effective, i.e., increasing the number of the elements (element density) per a unit area, is effective in increasing the cooling efficiency of the thermoelectric module.

According to the thermoelectric element taught in the prior art A, however, the shape factor L/S is as small as from 300/m to 1200/m, the sectional area of the element is large, the element density in the thermoelectric module is as small as about several tens per a square centimeter, and heat is not absorbed in sufficiently large amounts.

The thermoelectric module has a structure as schematically illustrated in FIG. 1, wherein n-type thermoelectric elements 2 and p-type thermoelectric elements 3 are alternately arranged on a support substrate 1 and are electrically connected in series through wiring conductors 4, the thermoelectric elements 2 and 3 being in a rectangular parallelepiped shape having a width W and a length (thickness) L. According to the prior art B, the thermoelectric element has a bottom surface of a square shape of a width W (sectional area S of the element is expressed by $W^2$), and the sectional area S of the element is decreased to increase the element sequences on the support substrate by one sequence in both the vertical direction and the lateral direction, in order to increase the element density. According to the prior art B, therefore, the shape of the thermoelectric element inevitably becomes slender since the sectional area S of the element is small. As the shape of the thermoelectric element becomes slender, however, breakage and deformation of the elements easily occur while the module is being assembled. This tendency becomes conspicuous as the shape factor (L/S) increases. There further occurs such a problem that the module that has been assembled loses the mechanical strength and the shock resistance, and exhibit deteriorated characteristics.

According to the conventional thermoelectric element as described above, it is difficult to set the shape factor to be an optimum value or to increase the element density for being used in the thermoelectric module, and the cooling efficiency is not obtained as desired.

SUMMARY OF THE INVENTION

It is therefore an object of the present invention to provide a thermoelectric element which is little subject to be broken or deformed even when the shape factor is increased or the element density is increased and a method of producing the same.

It is another object of the present invention to provide a thermoelectric module of high performance equipped with the above thermoelectric elements and featuring a high reliability and excellent cooling ability.

According to the present invention, there is provided a thermoelectric element formed of a sintered body of semiconductor particles comprising at least two kinds of elements selected from the group consisting of Bi, Te, Se and Sb, and having a micro-Vickers' hardness of not smaller than 0.5 GPa.

According to the present invention, there is further provided a thermoelectric module comprising a support substrate, a plurality of thermoelectric elements arranged on said support substrate and electrically connected to each other, wiring conductors for electrically connecting said plurality of thermoelectric elements together, and external connection terminals provided on said support substrate and electrically connected to said wiring conductors.

The thermoelectric element of the invention is formed of a semiconductor comprising at least two kinds of elements selected from the group consisting of Bi, Te, Se and Sb, and has a hardness (micro-Vickers' hardness) of not smaller than 0.5 GPa. As a result, the thermoelectric module using the thermoelectric elements is effectively prevented from being deformed or broken even when the element density is increased and the shape factor is increased.

In the invention, it is desired that the thermoelectric element has a resistivity which is not larger than $5 \times 10^{-5}$ Ωm. This makes it easy to suppress the Joule heat generated in the thermoelectric element and to control the temperature of the thermoelectric element to remain constant.

It is further desired that the thermoelectric module equipped with the thermoelectric elements has a shape factor of the thermoelectric elements of not smaller than 2000/m and an element density of not smaller than 100 elements/cm². Upon setting the shape factor and the element density to lie within the above-mentioned ranges, it is allowed to efficiently cool the heat generated in the thermoelectric elements and to effectively suppress the amount of heat generated in the thermoelectric elements.

In the thermoelectric module, further, it is desired that a minimum distance among the plurality of thermoelectric elements is from 200 to 400 μm. This makes it possible to increase the number of the elements per a unit area and to effectively suppress the electric short-circuit among the elements caused by a solder used for joining the elements to the electrodes.

According to the present invention, there is further provided a method of producing a thermoelectric element comprising the steps of:
preparing a starting powder of semiconductor particles containing at least two kinds of elements selected from the group consisting of Bi, Te, Se and Sb;
reducing said starting powder or a molded article of said starting powder with hydrogen;
starting the sintering by heating by feeding a pulse current to said starting powder or to said molded article after said reduction treatment with hydrogen;
starting the application of pressure of 25 MPa to 80 MPa near a temperature at which said starting powder or said molded article starts shrinking;
sintering said starting powder or said molded article at a temperature of not lower than 300° C. while applying the pressure; and
machining the obtained sintered body into a predetermined shape.

According to this method of production, the semiconductor particles become dense under a low pressure and within a short period of time, making it possible to obtain the above-mentioned highly hard thermoelectric element having a more homogeneous and finely crystalline texture.

According to the above method of production, the starting powder or the molded article is calcined by heating by supplying a pulse current under the application of a pressure. Concretely speaking, when the temperature at which the starting powder or the molded article starts shrinking is denoted by T, it is desired that the application of the pressure starts at a temperature of from (T−30) to (T+50)° C. Upon starting the application of pressure at such a timing, the starting powder or the molded article becomes dense under a low pressure within a short period of time without having to apply excess of energy, and it becomes easy to form a more homogeneous and finely crystalline texture.

DETAILED DESCRIPTION OF THE INVENTION

Thermoelectric Element

Figure 1:
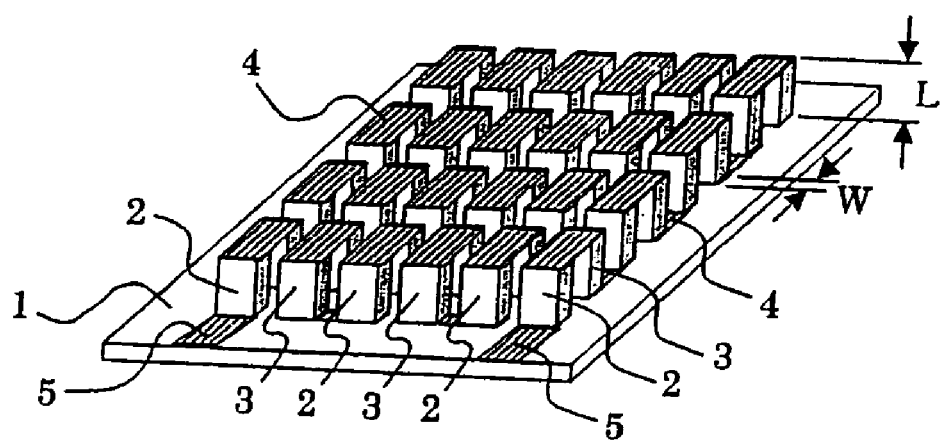
FIG. 1 is a view schematically illustrating the structure of a thermoelectric module.

It is important that the thermoelectric element of the present invention is formed of a sintered body of semiconductor particles containing at least two kinds of elements selected from the group consisting of Bi, Sb, Te and Se. There is no limitation on the composition of the semiconductor so far as the above two kinds of elements are contained. From the standpoint of thermoelectric characteristics, however, it is desired that the semiconductor is an $A_2B_3$-type intermetallic compound (A=Bi and/or Sb, B=Te and/or Se) or a solid solution thereof. From the standpoint of increasing the thermoelectric properties at room temperature, in particular, it is desired that the composition ratio (atomic ratio) B/A in the thermoelectric element is in a range of from 1.4 to 1.6.

As the $A_2B_3$-type intermetallic compound, there can be exemplified $Bi_2Te_3$, $Sb_2Te_3$, and $Bi_2Se_3$. These intermetallic compound may be used in a single kind or in a combination of two or more kinds.

As the solid solution of the $A_2B_3$-type intermetallic compound, there can be exemplified a solid solution of $Bi_2Te_3$ and $Bi_2Se_3$ having a composition expressed by the following formula, $$Bi_2Te_{3-x}Se_x \ (x=0.05 \text{ to } 0.25)$$

and a solid solution of $Bi_2Te_3$ and $Sb_2Te_3$ having a composition expressed by the following formula, $$Bi_xSb_{2-x}Te_3 \ (x=0.1 \text{ to } 0.6).$$

As the thermoelectric elements, there are a p-type thermoelectric element comprising a p-type semiconductor and an n-type thermoelectric element comprising an n-type semiconductor. Here, it is desired that the n-type thermoelectric element contains, as a dopant, a halogen compound such as AgI, CuBr, $SbI_3$, $SbCl_3$, $SbBr_3$ or $HgBr_2$ for adjusting the carrier concentration. The halogen compound is contained in the n-type thermoelectric element usually in an amount of from 0.01 to 5% by weight and, particularly, from 0.1 to 4% by weight. Further, it is desired that the p-type thermoelectric element (p-type semiconductor) contains an excess of Te to adjust the carrier concentration. Thus, the p-type thermoelectric element, too, exhibits an enhanced thermoelectric characteristics like the n-type thermoelectric element.

Though the thermoelectric element contains chiefly the crystalline particles of the above-mentioned semiconductor, it is desired that not less than 90% of the semiconductor crystalline particles have a scale-like shape with a long-axis diameter of not larger than 10 μm. Then, the thermoelectric element exhibits a thermoelectric figure of merit Z of not smaller than $2.8 \times 10^{-3}$/K and an output factor PF of not smaller than $3.5 \times 10^{-3}$/K. The thermoelectric figure of merit Z is expressed by the following formula, $$Z=\alpha^2/(\rho \cdot \kappa)$$

where
α is a Seebeck's coefficient,
ρ is a resistivity, and
κ is a thermal conductivity,
and serves as a parameter representing the efficiency of when the thermoelectric element is used as a cooling element or a generating element. The output factor PF is expressed by the following formula, $$PF=\alpha^2/\rho$$

wherein α and ρ are as defined above,
and serves as a parameter which particularly affects the amount of heat adsorption.

It is important that the thermoelectric element of the invention has a micro-Vickers' hardness of not smaller than 0.5 GPa, preferably, not smaller than 0.7 GPa and, most preferably, not smaller than 0.8 GPa. This prevents deformation due to vibration and shocks when the thermoelectric module is being assembled or is being used and prevents breakage caused by the deformation. Thus, the thermoelectric module exhibits improved mechanical reliability. For example, the thermoelectric element used for the thermoelectric module is obtained by machining a sintered body of semiconductor particles into a predetermined shape. Even when subjected to the machining, the thermoelectric element of the invention is effectively suppressed from being cut-away that results from the split-off of particles. The thermoelectric element is measured for its micro-Vickers' hardness by applying a load of 25 gf for 15 seconds.

In either the p-type thermoelectric element or the n-type thermoelectric element, it is desired that the resistivity is not larger than $5 \times 10^{-5}$ Ωm and, particularly, not larger than 1.5×

$10^{-5}$ Ωm. This makes it possible to suppress the Joule heat generated in the element and to execute the efficient cooling.

The above-mentioned thermoelectric element of the present invention features excellent mechanical strength and excellent cooling ability, and can be preferably used in the form of, for example, a thermoelectric module that will be described later for the electronically cooled devices such as a light detector and a semiconductor-manufacturing apparatus, and for the devices for maintaining the temperature constant for the semiconductor lasers and for the optical integrated circuits, and can further be preferably used for small refrigerators without using freon gas.

Production of Thermoelectric Element

Next, described below is a method of producing the thermoelectric element of the invention.

Starting Powder:

A powder of semiconductor particles is used as a starting powder. There is no particular limitation on the semiconductor particles provided they comprise a compound containing at least two kinds of elements selected from the group consisting of Bi, Sb, Te and Se. In particular, it is desired that the semiconductor particles include at least one kind of compound selected from $Bi_2Te_3$, $Bi_2Se_3$ and $Sb_2Te_3$. This lowers the probability of shift in the composition, and there is obtained a sintered body having a more homogeneous composition and texture. Upon mixing the starting powder to a sufficient degree, further, the homogeneity of the starting powder is maintained.

For example, when it is desired to produce a p-type thermoelectric element comprising a p-type semiconductor having a composition represented by the following formula,

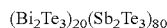

$$(Bi_2Te_3)_{20}(Sb_2Te_3)_{80}$$

there can be used a starting powder of $Bi_2Te_3$ and $Sb_2Te_3$ which are mixed at a molar ratio of 2:8. Further, when it is desired to produce an n-type thermoelectric element comprising an n-type semiconductor having a composition represented by the following formula,

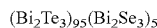

$$(Bi_2Te_3)_{95}(Bi_2Se_3)_{5}$$

there can be used a starting powder of $Bi_2Te_3$ and $Bi_2Se_3$ which are mixed at a molar ratio of 95:5.

It is desired that the semiconductor particles used for preparing the starting powder have a purity of not smaller than 99.9% by weight and, particularly, not smaller than 99.99% by weight and, more particularly, not smaller than 99.999% by weight. Impurities contained in the starting powder tend to deteriorate the semiconductor properties and thermoelectric properties. In order to stably prepare a thermoelectric element of high performance, therefore, the semiconductor particles having the above purities must be used.

To produce the n-type thermoelectric element, it is desired to add, as a dopant, a halogen compound such as AgI, CuBr, $SbI_3$, $SbCl_3$, $SbBr_3$ or $HgBr_2$ in order to adjust the carrier concentration. This makes it possible to stably obtain semiconductor properties. It is desired that the halogen compound is contained in the starting powder in an amount of from 0.01 to 5% by weight and, particularly, from 0.1 to 4% by weight.

The above-mentioned semiconductor particles are weighed to obtain an object composition and, as required, a dopant of a required amount is mixed therein to prepare a starting powder.

In the present invention, it is desired that the starting powder is mixed, pulverized and is classified to so adjust the particle size that the particle diameter (D50) (hereinafter simply referred to as average particle diameter) at a cumulative weight ratio of 50% is from 0.5 to 10 μm as measured by a laser diffraction method, the particle diameter (D90) at a cumulative weight ratio of 90% is from 0.7 to 20 μm, and a particle diameter ratio D90/D50 is from 1.2 to 4.0. By using the starting powder having such a particle size distribution, it is allowed to homogeneously distribute fine semiconductor crystalline particles in the sintered body. By using, for example, the above starting powder, not less than 90% of the semiconductor crystalline particles in the sintered body assume a scale-like shape with a long-axis diameter of not larger than 10 μm to maintain the above-mentioned high thermoelectric figure of merit Z and output factor PF. The particle size can be adjusted by a known method. In order to efficiently adjust the particle size while preventing the infiltration of impurities, it is desired to use an organic solvent such as methanol, ethanol, isopropanol, butanol or hexane, to effect the wet-pulverization by using a vibration mill, a barrel mill or a rotary ball mill, followed by classification. When the ball mill is used, it is desired to use silicon nitride balls to avoid infiltration of impurities from the balls.

Reduction Treatment:

The starting powder prepared as described above or a molded article obtained by molding the starting powder, is subjected to the reduction treatment with hydrogen. The reduction treatment with hydrogen is for removing oxygen introduced into the starting powder in the step of mixing or pulverization and is, usually, conducted by holding the starting powder or the molded article in a hydrogen gas atmosphere maintained at a temperature of 300 to 450° C. for about 1 to about 70 hours. Due to the reduction treatment with hydrogen, the amount of oxygen in the starting powder decreases, and the sintered body obtained through the firing that will be described later exhibits improved thermoelectric properties.

The reduction treatment with hydrogen can be conducted in any stage prior to the firing. Therefore, the powder may be put to the reduction treatment, or the molded article of a predetermined shape obtained from the starting powder may be put to the reduction treatment with hydrogen.

Molding:

In the present invention, as required, the above-mentioned starting powder is molded to prepare a molded article of a predetermined shape.

The molding is conducted by, for example, adding an organic binder to the starting powder to prepare a slurry thereof, and by conducting a known method such as metal mold pressing method, monoaxial pressing method, cold hydrostatic pressure pressing method (CIP method), doctor blade method, calendar rolling method, rolling method, extrusion molding method, casting method or injection molding method by using the above slurry. When the molding is conducted by the pressing method such as metal mold pressing method, the molding pressure is set to be from about 45 to about 100 MPa to easily conduct the molding and to obtain a molded article which can be easily handled.

Firing:

In the present invention, the above-mentioned starting powder or the molded article obtained from the starting powder is fired to obtain a p-type thermoelectric element or an n-type thermoelectric element of a sintered body of a p-type semiconductor or of an n-type semiconductor depending upon the composition of the starting powder.

The firing can be conducted by a known method such as electric discharge plasma sintering method (SPS), hot pressing method (HI), gaseous pressure sintering method (GPS) or hot isotropic pressurized sintering method, provided the sintering is conducted by heating by supplying a pulse current under the application of a pressure under predetermined conditions. However, the gaseous pressure sintering method is not suited since it is difficult to control the pressurizing conditions that will be described later.

When the starting powder is to be fired without preparing the molded article, for example, a cylindrical carbon die is filled with the starting powder, the die filled with the starting powder is held by compressive pulse current-feeding punches from the upper and lower sides, and these jigs are set in the sintering furnace to start the firing. At the time of setting, the pressure (usually about 1 MPa) must be inevitably applied to hold the die. However, this pressure is as low as not larger than 5 MPa, and does not affect the sintering.

When the molded article obtained from the starting powder is to be fired, the molded article is introduced into a die located, for example, between the upper and lower compressive pulse current-feeding punches, and is fired after the binder is removed therefrom. The binder is removed under the application of no pressure, and does not adversely affect the sintering.

The firing is conducted by heating by flowing a pulse current. For example, a pulse voltage is applied to the starting powder filled in the die or to the molded article put into the die to intermittently feed a current, whereby the firing is accomplished as the temperature is raised by the heat generated therein due to the electric discharge and Joule heat.

In the present invention, the firing by heating by feeding the pulse current is conducted under a pressurized condition. Application of the pressure starts near at a temperature at which the particles of the starting powder starts shrinking (shrink start temperature). Upon conducting the firing by applying the pressure at such a timing, the semiconductor particles become dense under a low pressure within a short period of time, and there is obtained a sintered body having a more homogeneous and fine semiconductor crystalline texture.

In the present invention, the timing of applying the pressure plays an important role for developing a homogeneous and fine crystalline texture, for saving wasteful energy and for decreasing the cost. Concretely speaking, when the temperature at which the starting powder starts shrinking is denoted by T, the application of pressure starts at a temperature of from (T−30) to (T+50)° C. and, particularly, from (T−20) to (T+30)° C. Upon applying the pressure nearly simultaneously with the start of shrinking, the sintering is promoted and the semiconductor particles become dense under a low pressure within a short period of time without requiring excess of energy, suppressing the growth of particles, enabling the particles to be strongly bonded together on the grain boundaries, and making it possible to obtain a sintered body having homogeneous and fine semiconductor crystalline particles. When the pressure is maintained applied from the start of firing as is done in the prior art, gases evolved from the starting powder and from the die are not efficiently removed and, besides, an inhomogeneous and locally porous texture is formed due to uneven pressure, and the obtained sintered body (thermoelectric element) exhibits a low hardness.

A displacement gauge may be set to the die holding the starting powder or the molded article, and the application of pressure may be started at a moment when the displacement (shrinkage) of the starting powder or of the molded article is detected by the displacement gauge. It is further allowable to conduct an experiment in advance by using the displacement gauge to measure a temperature (shrink start temperature) at which the displacement (shrinking) takes place, and to start the application of pressure near the shrink start temperature T based on the result of measurement. Further, the shrink start temperature T of the starting powder varies depending upon the average particle diameter of the starting powder. When the starting powder has a small average particle diameter, the shrink start temperature T is low. When the starting powder has a large average particle diameter, the shrink start temperature T is high. For example, when the starting powder has an average particle diameter of not larger than 10 µm, the shrink start temperature T is usually not higher than 100° C. and when the starting powder has an average particle diameter which is in excess of 10 µm, the shrink start temperature T is usually not higher than 200° C.

In the present invention, the pressure applied at the above timing is set to be in a range of from 25 to 80 MPa and, particularly, from 28 to 40 MPa. When the applied pressure is smaller than the above range, it becomes difficult to obtain a densely sintered body. In this case, if the sintering temperature is raised to obtain a dense body, Te and Se that easily undergo sublimation tend to scatter, and the composition is shifted. When the applied pressure is larger than the above range, on the other hand, an excess of energy is imparted whereby the crystalline particles grow and, as a result, the thermal conductivity increases causing the properties to be deteriorated. Further, the die tends to be deteriorated and broken, resulting in a decrease in the yield and in an increase in the cost.

It is desired that the firing atmosphere is that of an inert gas such as He, Ar or Ne, that of a non-oxidizing gas such as $H_2$ or $N_2$, or vacuum in order to suppress the reaction with oxygen as much as possible and to further improve the thermoelectric figure of merit Z of the obtained thermoelectric element. From the standpoint of obtaining the reducing effect simultaneously with the sintering, the $H_2$ atmosphere is desired. From the standpoint of safety and cost, the Ar atmosphere is desired or a mixed gas of $H_2$ and Ar may be used.

In the present invention, the heating by feeding a pulse current is continued while applying the pressure at the above-mentioned timing, and the sintering is effected by maintaining the starting powder or the molded article at a temperature of not lower than 300° C. and, particularly, at 300 to 500° C. in order to obtain a desired thermoelectric element (sintered body). The time for holding in the above temperature region may differ depending upon the composition of the starting powder but is, usually, from about 0.1 to about 1 hour. Owing to the above sintering, it is allowed to obtain a densely sintered body having a relative density of, for example, not smaller than 97%, particularly, not smaller than 98% and, more particularly, not smaller than 99%.

Machining:

The thus obtained sintered body is, as required, polished for its surfaces and is machined, such as, cut to obtain a thermoelectric element having a desired shape.

The sintered body obtained by the above-mentioned method is highly hard and exhibits excellent mechanical properties, effectively suppressing the particles from being split off during the step of machining. For example, since the particles are suppressed from being split off, a maximum depth of cut in the surface of the obtained thermoelectric element is not larger than 50 µm. The maximum depth is found by observing a portion from where the particles are being split off by using an operation-type electron microscope (SEM) to measure a maximum size (R1) thereof and, at the same time, by measuring a maximum surface roughness (Rmax) by using a surface roughness meter. Either R1 or Rmax whichever is larger, is regarded as the maximum depth.

The thus obtained thermoelectric element has an excellent strength, is effectively prevented from being broken or deformed at the time of fabricating, for example, a thermoelectric module, and can be used for the thermoelectric module featuring excellent shock resistance, durability and good reliability.

Thermoelectric Module

The thermoelectric module of the present invention has a structure as schematically illustrated in FIG. 1, wherein a number of thermoelectric elements 2 (e.g., p-type thermoelectric elements) and thermoelectric elements 3 (e.g., n-type thermoelectric elements) are arranged in pairs on a support substrate 1 made of an insulating material such as alumina ceramics, and are electrically connected together through wiring conductors 4. Further, external connection terminals 5 are formed on the support substrate 1, and the wiring conductors 4 are electrically connected to the external connection terminals 5. That is, as is obvious from FIG. 1, the number of pairs of p-type thermoelectric elements 2 and n-type thermoelectric elements 3 are electrically connected in series, and the n-type thermoelectric element 3 are necessarily connected to the p-type thermoelectric elements 2.

In the thermoelectric module of the present invention, the above-mentioned highly hard thermoelectric elements are used as the thermoelectric elements 2 and 3. Therefore, the thermoelectric elements 2 and 3 are effectively prevented from being broken or deformed in assembling the module, and are further effectively prevented from being deformed by the vibration or shock while the thermoelectric module is in operation, and are effectively prevented from being broken by the deformation, offering a structure that features excellent shock resistance and durability.

In the thermoelectric module of the invention featuring excellent shock resistance and durability, it is allowed to set the shape factor L/S (L=thickness of the thermoelectric element, S=sectional area of the thermoelectric element) of the thermoelectric elements 2 and 3 to a large value, making it possible to enhance the cooling efficiency of the heat-generating body and to improve the reliability of the thermoelectric module.

In the thermoelectric module of the present invention, for example, it is desired that the shape factor L/S of the thermoelectric elements 2 and 3 are not smaller than 2000/m, particularly, not smaller than 3000/m, more particularly, not smaller than 5000/m and, most particularly, not smaller than 7000/m. When the shape factor L/S is small, the Joule heat generated in the thermoelectric elements 2 and 3 is little radiated, whereby the cooling efficiency decreases and a desired cooling temperature is not accomplished. In the thermoelectric module of the present invention which uses highly hard thermoelectric elements, the shape factor L/S can, usually, be heightened to a maximum of 30,000/m.

In the present invention, further, it is desired that the element density (number of the thermoelectric elements per a unit area of the support substrate 1) in the thermoelectric module is not smaller than 100 elements/cm$^2$, preferably, not smaller than 120 elements/cm$^2$ and, most preferably, not smaller than 140 elements/cm$^2$. When the element density is small, heat may not be adsorbed in sufficient amounts.

As the number of the thermoelectric elements 2 and 3 arranged on the support substrate 1 increases, the amount of absorbing heat on the low-temperature side of the module increases to increase the cooling efficiency. However, an increase in the number of the thermoelectric elements results in an increase in the size of the module, which is not desirable.

In the present invention, the sectional areas S of the thermoelectric elements 2 and 3 are decreased and the number of the elements is increased per the unit area, making it possible to arrange an increased number of the elements in a limited space to realize the thermoelectric module of a small size having a high efficiency.

In the thermoelectric module of the present invention, further, it is desired that the narrowest distance (shortest distance) among the plurality of thermoelectric elements 2 and 3 is from 200 to 400 μm and, particularly, from 250 to 350 μm. The thermoelectric elements 2 and 3 are joined to the wiring conductors 4 and to the external terminals 5 by using, usually, a solder paste. When the shortest distance is smaller than the above range, the problem of electric short-circuit tends to occur among the thermoelectric elements 2 and 3 due to the solder paste. When the shortest distance is larger than the above range, the number of the thermoelectric elements decreases per the unit area, and the size of the module increases or the amount of heat adsorption decreases.

According to the present invention, the thermoelectric elements 2 and 3 suppress the occurrence of defects caused by the split-off of particles, i.e., have very small defects in the surface, a maximum depth of the defects being not larger than 50 μm. Accordingly, various kinds of inconvenience stemming from the defects are effectively avoided. For example, there exists a large difference in the coefficient of thermal expansion between the thermoelectric elements 2, 3 and the support substrate 1 holding them. Further, the thermoelectric module is often used in combination with a substrate for cooling in a manner that the thermoelectric elements 2, 3 are sandwiched between the support substrate 1 and the substrate for cooling. In this case, too, the difference in the coefficient of thermal expansion is great between the substrate for cooling and the thermoelectric elements 2, 3. Therefore, when the thermoelectric module is repetitively operated, i.e., when the pulse current is fed to the thermoelectric elements 2, 3 repetitively, there occurs a slight distortion in the thermoelectric elements 2 and 3 due to the difference in the coefficient of thermal expansion, whereby the stress concentrates in the defective portion which, then, develop into cracks. The cracks could become a barrier (gap) when the pulse current is fed and, hence, a cause of short-circuit. Therefore, the thermoelectric module usually involves a problem in that the characteristics decrease accompanying the repetition of operation though the initial characteristics may have been favorable. Such a drop in the characteristics is not quite desirable particularly for cooling the laser diode, i.e., repeating the on-off of cooling over extended periods of time. Further, the thermoelectric elements of high performance having, for example, a thermoelectric figure of merit Z of not smaller than $2.8 \times 10^{-3}$/K and an output factor PF of not smaller than $3.5 \times 10^{-3}$/K, tend to lose the characteristics to a large extent.

On the other hand, the thermoelectric elements 2 and 3 used for the thermoelectric module of the present invention have very small defects in the surface, and effectively suppresses the occurrence of cracks even after repetitively used. Therefore, the thermoelectric module of the present invention has an advantage of a small drop in the characteristics. For example, the substrate for cooling is provided on the thermoelectric module of the present invention, is held by the support substrate being maintained at 60° C. in a manner that the thermoelectric elements 2 and 3 are sandwiched between the support substrate 1 and the substrate for cooling and, in this state, a maximum current Imax is fed to the thermoelectric elements 2 and 3 for 90 seconds and is, then, interrupted for 270 seconds to constitute a cycle. Even after the output testing is conducted by repeating this cycle 10,000 times, a change in the electric resistance is as small as 8% or less (the maximum current Imax is the one with which the temperature of the substrate for cooling becomes the lowest).

The thermoelectric module of the present invention constituted as described above exhibits excellent cooling efficiency, and is particularly suited for use in a device for maintaining the temperature constant for semiconductor lasers and optical integrated circuits, and for use in small refrigerators.

EXAMPLES

Experiment 1

As starting materials, there were prepared $Bi_2Te_3$, $Sb_2Te_3$ and $Bi_2Se_3$ having an average particle diameter of 35 μm and a purity of not smaller than 99.99%.

To form an n-type thermoelectric element, the starting compounds were so weighed and mixed together as to form $Bi_2Te_{2.85}Se_{0.15}$. Further, as a dopant, $SbI_3$ was added in an amount of 0.09 parts by weight per 100 parts by weight of the sum of the starting compounds thereby to prepare a starting powder.

In order to form a p-type thermoelectric element, further, the starting compounds were so weighed and mixed together as to form $Bi_{0.4}Sb_{1.6}Te_3$ to thereby prepare a starting powder.

The above starting powders were stirred in an isopropyl alcohol solvent by using a vibration mill for 5 to 72 hours, and the average particle diameter thereof was variously changed as shown in Table 1. The average particle diameter was found by measuring the particle size distribution after the treatment by using the vibration mill.

The starting powder treated by using the vibration mill was dried, molded into a molded article having a diameter of 20 mm and a thickness of 5 mm by using a monoaxial press under a pressing pressure of 49 MPa, and was reduced in a furnace in a hydrogen stream at 400° C. for 5 hours.

Then, the reduced molded article was set to a carbon die of a cylindrical shape, held by compressive pulse current-feeding punches made of carbon from the upper and lower sides, set into a sintering furnace, the interior of the furnace was substituted with Ar, and was heated at a rate of 100°/min by feeding a pulse current by using the compressive pulse current-feeding punches to commence the sintering by an electric discharge plasma sintering method (SPS). In conducting the sintering, the displacement (shrinkage) of the molded article was detected by using a displacement gauge. A moment at which the displacement commences was regarded to be a shrink start temperature, and the pressure was applied at a timing shown in Table 1, and was held at 300 to 500° C. for 10 minutes to conduct the sintering.

After the sintering has been finished, the furnace was cooled. When the temperature became lower than 50° C., the sample was taken out. The sample taken out was sliced and diced into a shape of 0.6 mm deep, 0.6 mm wide and 0.9 mm long to thereby obtain thermoelectric elements (samples Nos. 1 to 25).

Further, the molded article prepared above was set to the carbon die, and was sintered by the HP method while heating it by feeding a pulse current. The pressure of 49 MPa was applied from the start of the sintering to conduct the firing at 500° C. for 10 minutes. After the sintering, the machining was conducted in the same manner as described above to obtain thermoelectric elements (samples Nos. 26 and 27).

The obtained thermoelectric elements were measured for their properties as described below. The results were as shown in Table 1.

Relative Density:

Measured in compliance with the Archimedes' method.

Thermoelectric Figure of Merit Z:

The resistivity ρ and Seebeck's coefficient α were measured at a temperature of 20° C. by using a thermoelectric ability-evaluating apparatus manufactured by Shinku Rikosha Co. Further, the thermal conductivity κ was measured at a temperature of 20° C. by a laser flashing method, and the thermoelectric figure of merit Z was calculated according to the following formula to find an average value thereof, $$Z=\alpha^2/(\rho \cdot \kappa)$$

Micro-Vickers Hardness:

Measured by using a micro-vickers hardness meter. Namely, a pressing rod was pushed into the surface of the thermoelectric element with a load of 25 gf for 15 second. After the load was removed, the length of the diagonal line of the indentation formed in the surface was measured to calculate the hardness.

TABLE 1

| | | Starting material | | | | | Production method | | | | | | Properties | | |
| | | Starting composition | | | | | | Pressing | | | Heat Treatment | | | | |
| Sample No. | Semi-conductor type | BT mol | ST mol | BS mol | SI wt parts | Particle diameter μm | Firing method | T °C. | Start temp. °C. | Pressure MPa | dif-ference °C. | Temp. °C. | Time min | Density g/cm³ | Figure of merit $10^{-3}$/K | Resistivity $10^{-5}$ Ωm | Hv Gpa |
|---|---|---|---|---|---|---|---|---|---|---|---|---|---|---|---|---|---|
| 1 | P | 20 | 80 | — | — | 1.5 | SPS | 50 | 58 | 49 | 8 | 450 | 10 | 99.3 | 3.23 | 0.94 | 0.89 |
| 2 | P | 20 | 80 | — | — | 3.2 | SPS | 61 | 69 | 49 | 8 | 450 | 10 | 99.8 | 3.62 | 0.92 | 0.82 |
| 3 | P | 20 | 80 | — | — | 6.6 | SPS | 82 | 87 | 49 | 5 | 450 | 10 | 99.1 | 3.53 | 0.90 | 0.8 |
| 4 | P | 20 | 80 | — | — | 9.8 | SPS | 95 | 106 | 49 | 11 | 450 | 10 | 99.2 | 3.65 | 0.89 | 0.78 |
| 5 | P | 20 | 80 | — | — | 15.3 | SPS | 155 | 160 | 49 | 5 | 450 | 10 | 98.6 | 3.56 | 0.87 | 0.75 |
| 6 | P | 20 | 80 | — | — | 20.8 | SPS | 182 | 189 | 49 | 7 | 450 | 10 | 98.3 | 3.34 | 0.86 | 0.71 |
| 7 | P | 20 | 80 | — | — | 1.5 | SPS | 50 | 60 | 29.4 | 10 | 450 | 10 | 98.2 | 3.21 | 0.94 | 0.85 |
| 8 | P | 20 | 80 | — | — | 1.5 | SPS | 50 | 59 | 39.2 | 9 | 450 | 10 | 99.2 | 3.57 | 0.93 | 0.87 |
| 9 | P | 20 | 80 | — | — | 1.5 | SPS | 50 | 60 | 49 | 10 | 400 | 10 | 99 | 3.64 | 0.92 | 0.86 |
| 10 | P | 20 | 80 | — | — | 1.5 | SPS | 50 | 54 | 49 | 4 | 350 | 10 | 99.2 | 3.58 | 0.93 | 0.82 |
| 11 | P | 20 | 80 | — | — | 1.5 | SPS | 50 | 59 | 49 | 9 | 300 | 10 | 99.4 | 3.65 | 0.95 | 0.76 |
| 12 | N | 95 | — | 5 | 0.09 | 1.2 | SPS | 45 | 53 | 49 | 8 | 450 | 10 | 99.1 | 3.61 | 0.96 | 0.98 |
| 13 | N | 95 | — | 5 | 0.09 | 2.9 | SPS | 58 | 68 | 49 | 10 | 450 | 10 | 99.2 | 3.54 | 0.92 | 0.92 |
| 14 | N | 95 | — | 5 | 0.09 | 6.2 | SPS | 79 | 83 | 49 | 4 | 450 | 10 | 98.3 | 3.55 | 0.92 | 0.88 |
| 15 | N | 95 | — | 5 | 0.09 | 9.5 | SPS | 92 | 98 | 49 | 6 | 450 | 10 | 99.7 | 3.58 | 0.90 | 0.83 |

TABLE 1-continued

| | Starting material | | | | | | Production method | | | | | | | Properties | | |
| | Semi- | Starting composition | | | | | Pressing | | | | Heat Treatment | | | Figure | Resis- | |
| Sample No. | conductor type | BT mol | ST mol | BS mol | SI wt parts | Particle diameter μm | Firing method | T °C. | Start temp. °C. | Pressure MPa | Temp. difference °C. | Temp. °C. | Time min | Density g/cm³ | of merit 10⁻³/K | tivity 10⁻⁵ Ωm | Hv Gpa |
|---|---|---|---|---|---|---|---|---|---|---|---|---|---|---|---|---|---|
| 16 | N | 95 | — | 5 | 0.09 | 14.4 | SPS | 151 | 150 | 49 | −1 | 450 | 10 | 98.5 | 3.57 | 0.88 | 0.79 |
| 17 | N | 95 | — | 5 | 0.09 | 19.8 | SPS | 179 | 169 | 49 | −10 | 450 | 10 | 98.4 | 3.52 | 0.87 | 0.75 |
| 18 | N | 95 | — | 5 | 0.09 | 1.2 | SPS | 45 | 52 | 29.4 | 7 | 450 | 10 | 98.8 | 3.57 | 0.92 | 0.93 |
| 19 | N | 95 | — | 5 | 0.09 | 1.2 | SPS | 45 | 54 | 39.2 | 9 | 450 | 10 | 98.2 | 3.54 | 0.95 | 0.96 |
| 20 | N | 100 | — | — | 0.09 | 1.2 | SPS | 45 | 58 | 49 | 13 | 400 | 10 | 98.4 | 3.52 | 0.98 | 0.96 |
| 21 | N | 95 | — | 10 | 0.09 | 1.2 | SPS | 45 | 54 | 49 | 9 | 350 | 10 | 98.5 | 3.55 | 0.94 | 0.92 |
| 22 | N | 90 | — | 16 | 0.09 | 1.2 | SPS | 45 | 52 | 49 | 7 | 300 | 10 | 99.2 | 3.61 | 0.90 | 0.87 |
| *23 | P | 20 | 80 | — | — | 1.5 | SPS | 45 | 55 | 15 | 10 | 450 | 10 | 97.1 | 2.94 | 0.91 | 0.46 |
| *24 | P | 20 | 80 | — | — | 1.5 | SPS | — | — | 49 | — | 450 | 10 | 98.1 | 3.28 | 0.93 | 0.42 |
| *25 | N | 85 | — | 15 | 0.09 | 1.2 | SPS | 45 | 53 | 60 | 8 | 500 | 10 | Die broken | | | |
| *26 | P | 20 | 80 | — | — | 1.5 | HP | — | — | 49 | — | 500 | 10 | 97.1 | 2.94 | 1.34 | 0.42 |
| *27 | N | 95 | — | 5 | 0.09 | 1.2 | HP | — | — | 49 | — | 500 | 10 | 97.3 | 2.81 | 1.24 | 0.45 |

Samples marked with *lie outside the scope of the invention.
BT: $Bi_2Te_3$ ST: $Sb_2Te_3$ BS: $Bi_2Se_3$ SI: $SbI_3$
SPS: Spark plasma sintering method HP: Hot press sintering method
T: Shrink start temperature Hv: Micro-Vickers' hardness From the results of Table 1, it will be understood that the samples Nos. 1 to 22 of the present invention exhibited relative densities of not smaller than 98.2%, and that the thermoelectric elements having high thermoelectric performance were obtained within relatively short periods of time without requiring a high pressure. Besides, the obtained thermoelectric elements all exhibited micro-Vickers' hardness Hv of not smaller than 0.71 GPa.

On the other hand, the sample No. 23 with a pressing pressure of as small as 15 MPa exhibited a hardness Hv of 0.46 GPa.

The sample No. 25 with the pressing pressure of 60 MPa caused the die to be broken during the firing, and a sintered body was not obtained.

The samples Nos. 26 and 27 obtained by the HP method while applying the pressure from the start of firing exhibited the hardness Hv of not larger than 0.45 GPa.

The sample No. 24 obtained by the SPS method by applying the pressure from the start of firing exhibited the hardness Hv of as low as 0.42 GPa.

Experiment 2

Various sintered bodies obtained in Experiment 1 were sliced into a predetermined thickness by using a wire saw to cut out wafers. A nickel electrode and a gold electrode were formed on the wafers by plating, and the wafers were cut into predetermined chips to obtain thermoelectric elements having electrodes.

The thermoelectric elements were arranged on an alumina ceramic insulating substrate (6 mm deep and 8.2 mm wide) having a copper electrode on the surface thereof, and were secured to the copper electrode via a solder layer in order to fabricate thermoelectric modules having shape factors L/S, element densities d and the shortest distances D among the elements as shown in Table 2.

While changing the current fed to the thermoelectric elements, the thermoelectric modules were measured for their maximum currents Imax with which the heat-generating member absorbs the heat in the greatest amount, and the maximum heat-absorbing amounts Qcmax. The results were as shown in Table 2.

TABLE 2

| | Starting material/Sintered body | | | | Shape of thermoelectric element | | | | | Property | |
| Sample No. | Kind | Particle diameter μm | Resistivity 10⁻⁵ Ωm | Hv Gpa | W mm | L mm | L/S/m | d per/cm² | D μm | $I_{max}$ A | $Qc_{max}$ W |
|---|---|---|---|---|---|---|---|---|---|---|---|
| 28 | N-type | 1.2 | 0.96 | 0.98 | 0.5 | 0.82 | 3280 | 126 | 350 | 1.3 | 3.1 |
| | P-type | 1.5 | 0.94 | 0.89 | | | | | | | |
| 29 | N-type | 2.9 | 0.92 | 0.92 | 0.5 | 0.82 | 3280 | 126 | 350 | 1.3 | 3.2 |
| | P-type | 3.2 | 0.92 | 0.82 | | | | | | | |
| 30 | N-type | 9.5 | 0.90 | 0.83 | 0.5 | 0.82 | 3280 | 126 | 350 | 1.3 | 3.2 |
| | P-type | 9.8 | 0.89 | 0.78 | | | | | | | |
| 31 | N-type | 19.8 | 0.87 | 0.75 | 0.5 | 0.82 | 3280 | 126 | 350 | 1.3 | 3.4 |
| | P-type | 20.8 | 0.86 | 0.71 | | | | | | | |
| 32 | N-type | 1.2 | 0.96 | 0.98 | 0.54 | 0.8 | 2743 | 126 | 350 | 1.6 | 3.5 |
| | P-type | 1.5 | 0.94 | 0.89 | | | | | | | |
| 33 | N-type | 1.2 | 0.96 | 0.98 | 0.6 | 0.72 | 2000 | 126 | 350 | 2 | 4.6 |
| | P-type | 1.5 | 0.94 | 0.89 | | | | | | | |
| 34 | N-type | 1.2 | 0.96 | 0.98 | 0.5 | 0.75 | 3000 | 158 | 250 | 1.4 | 4.1 |
| | P-type | 1.5 | 0.94 | 0.89 | | | | | | | |

TABLE 2-continued

| | | Starting material/Sintered body | | | Shape of thermoelectric element | | | | | Property | |
|---|---|---|---|---|---|---|---|---|---|---|---|
| Sample No. | Kind | Particle diameter μm | Resistivity $10^{-5}$ Ωm | Hv Gpa | W mm | L mm | L/S/m | d per/cm² | D μm | $I_{max}$ A | $Qc_{max}$ W |
| 35 | N-type | 1.2 | 0.96 | 0.98 | 0.4 | 0.8 | 5000 | 219 | 230 | 0.9 | 4.0 |
|  | P-type | 1.5 | 0.94 | 0.89 | | | | | | | |
| 36 | N-type | 1.2 | 0.96 | 0.98 | 0.35 | 0.8 | 6631 | 264 | 233 | 0.7 | 3.8 |
|  | P-type | 1.5 | 0.94 | 0.89 | | | | | | | |
| 37 | N-type | 1.2 | 0.96 | 0.98 | 0.31 | 0.8 | 8325 | 313 | 220 | 0.57 | 3.3 |
|  | P-type | 1.5 | 0.94 | 0.89 | | | | | | | |
| 38 | N-type | 1.2 | 0.96 | 0.98 | 0.32 | 1.2 | 11719 | 313 | 210 | 0.5 | 3.1 |
|  | P-type | 1.5 | 0.94 | 0.89 | | | | | | | |
| 39 | N-type | 1.2 | 0.96 | 0.98 | 0.32 | 1.8 | 17578 | 313 | 210 | 0.3 | 2.8 |
|  | P-type | 1.5 | 0.94 | 0.89 | | | | | | | |
| 40 | N-type | 1.2 | 0.96 | 0.98 | 0.32 | 2.8 | 27344 | 313 | 210 | 0.2 | 2.4 |
|  | P-type | 1.5 | 0.94 | 0.89 | | | | | | | |
| *41 | N-type | 1.2 | 1.24 | 0.46 | 0.75 | 1 | 1778 | 100 | 350 | 2.2 | 2.8 |
|  | P-type | 1.5 | 1.34 | 0.42 | | | | | | | |
| *42 | N-type | 1.2 | 1.24 | 0.46 | 0.54 | 0.8 | 2743 | 158 | 225 | broken | |
|  | P-type | 1.5 | 1.34 | 0.42 | | | | | | | |

Samples marked with *lie outside the scope of the invention.

In the case of the thermoelectric modules of the samples Nos. 28 to 40 having the shape factors L/S of not smaller than 2000/m and element densities d of not smaller than 126 elements/cm², the maximum current Imax was not larger than 2 amperes, and the maximum heat-absorbing amount Qcmax was not smaller than 2.4 watts.

In the case of the thermoelectric module of the sample No. 41 having the shape factor L/S of as small as 1778/m, the maximum current Imax was as large as 2.2 amperes.

In the case of the sample No. 42 using the thermoelectric elements having Hv of as small as not larger than 0.46 GPa, the thermoelectric elements were deformed and were broken in the module when the element density was increased to 158 elements/cm² and the L/S was increased to 2743/m.

The invention claimed is:

1. A thermoelectric element formed of a sintered body of a semiconductor comprising at least two kinds of elements selected from the group consisting of Bi, Te, Se and Sb, and having a micro-Vickers' hardness of not smaller than 0.71 GPa and a relative density of not smaller than 98.2%, containing crystalline particles of said semiconductor, and not less than 90% of said semiconductor crystalline particles having a scale-shape with a long-axis diameter of not longer than 10 μm,
   wherein said sintered body is obtained by firing a starting powder or a molded article of said starting powder to be fired by feeding a heating pulse electric current and applying a pressure of from more than 28 MPa to less than 50 MPa, said pressure being applied at such a timing that the pressurization starts near a temperature at which the powder or the article starts shrinking, and
   wherein said thermoelectric element is obtained by machining the sintered body, and
   wherein cut-away defects caused by split-off of the crystalline particles occurred in the surfaces of said elements are suppressed in size to be not larger than 50 μm in maximum depth.

2. A thermoelectric element according to claim 1, wherein the thermoelectric element has a resistivity which is not larger than $1.5 \times 10^{-5}$ Ωm.

3. A thermoelectric element according to claim 1, wherein said sintered body further comprises a halogen compound.

4. A thermoelectric element according to claim 1, wherein said feeding a heating pulse electric current and applying a pressure of from more than 28 MPa to less than 50 MPa are conducted by a spark plasma sintering method.

5. A thermoelectric element according to claim 1, wherein when the temperature at which the powder or the article starts shrinking is denoted by T, the application of the pressure starts at a temperature of from (T−10) to (T+13)° C.

* * * * *